(12) United States Patent
Sakai et al.

(10) Patent No.: US 7,633,072 B2
(45) Date of Patent: Dec. 15, 2009

(54) SCINTILLATOR PLATE

(75) Inventors: Mika Sakai, Hino (JP); Takehiko Shoji, Hachioji (JP)

(73) Assignee: Konica Minolta Medical & Graphic, Inc., Tokyo (JP)

( * ) Notice: Subject to any disclaimer, the term of this patent is extended or adjusted under 35 U.S.C. 154(b) by 76 days.

(21) Appl. No.: 11/828,893

(22) Filed: Jul. 26, 2007

(65) Prior Publication Data

US 2008/0023648 A1    Jan. 31, 2008

(30) Foreign Application Priority Data

Jul. 31, 2006    (JP) ............................ 2006-207628

(51) Int. Cl.
   *G01N 21/64* (2006.01)
(52) U.S. Cl. .................................. 250/483.1
(58) Field of Classification Search ............... 250/483.1
   See application file for complete search history.

(56) References Cited

U.S. PATENT DOCUMENTS

| | | | | |
|---|---|---|---|---|
| 4,453,078 A | * | 6/1984 | Shimizu | 250/425 |
| 4,839,090 A | * | 6/1989 | Rosette et al. | 252/301.4 H |
| 5,028,509 A | * | 7/1991 | Shimada et al. | 430/139 |
| 2002/0037362 A1 | * | 3/2002 | Wieczorek et al. | 427/65 |

OTHER PUBLICATIONS

S. Dierks, Material Safety Data Sheet, Jun. 2004, ESPI, 3 pages.*

* cited by examiner

*Primary Examiner*—David P Porta
*Assistant Examiner*—Mindy Vu
(74) *Attorney, Agent, or Firm*—Finnegan, Henderson, Farabow, Garrett & Dunner, L.L.P.

(57) ABSTRACT

Disclosed is a scintillator plate comprising on a substrate a phosphor layer formed by a process of vapor deposition, wherein a thallium compound having a melting point within ±70° C. of that of CsI and CsI are deposited on a substrate to form a thallium-activated phosphor layer.

8 Claims, 1 Drawing Sheet

SCINTILLATOR PLATE

This application claims priority from Japanese Patent Application No. JP2006-207628 filed on Jul. 31, 2006, which is incorporated hereinto by reference.

FIELD OF THE INVENTION

The present invention relates to a scintillator plate (hereinafter, also denoted as a radiation image conversion panel) for use in formation of a radiation image of the object.

BACKGROUND OF THE INVENTION

There have been broadly employed radiographic images such as X-ray images for diagnosis of the conditions of patients on the wards. Specifically, radiographic images using a intensifying-screen/film system have achieved enhancement of speed and image quality over its long history and are still used on the scene of medical treatment as an imaging system having high reliability and superior cost performance in combination. However, these image data are so-called analog image data, in which free image processing or instant image transfer cannot be realized.

Subsequently, there appeared computed radiography (also denoted simply as CR) as a radiographic image detection apparatus in a digital system. In the CR, digital radiographic images are directly obtained and can be displayed on an image display apparatus such as a cathode tube or liquid crystal panels, which renders it unnecessary to form images on photographic film and results in drastic improvement of convenience for diagnosis in hospitals or medical clinics.

The CR has been accepted mainly in medical sites, where X-ray images are obtained using a photostimulable phosphor plate. The photostimulable phosphor plate is one in which a radiation having been transmitted through an object is accumulated and excited in a time-series manner upon exposure to electromagnetic waves (exciting light) such as infrared light, whereby the accumulated radiation is emitted as stimulated emission at an intensity corresponding to the radiation dosage and which is constituted of a laminar photostimulable phosphor on a prescribed substrate.

However, this photostimulable phosphor plate, which is not sufficient in signal-to-noise ratio or sharpness and is also insufficient in spatial resolution, has not yet reached the image quality level of the conventional screen/film system.

Further, there appeared, as a digital X-ray imaging technology, an X-ray flat panel detector (FPD) using a thin film transistor (TFT), as set forth in, for example, an article "Amorphous Semiconductor Usher in Digital X-ray Imaging" described in Physics Today, November, 1997, page 24 and also in an article "Development of a High Resolution, Active Matrix, Flat-Panel Imager with Enhanced Fill Factor" described in SPIE, vol. 32, page 2 (1997).

The FPD has advantages such that it is superior to the CR in terms of downsizing of the apparatus being feasible and a moving image display. However, similarly to the CR, the FPT has not yet reached the image quality level of the screen/film system, so that desire for high image quality increased recently.

The FPD system employs a scintillator plate made of an emissive X-ray phosphor to convert radiation to visible light, in which electrical noise generated in TFT or in the circuit to drive the TFT is relatively high, so that even in imaging at a low dose, the SN ratio is lowered, making it difficult to ensure emission efficiency to maintain desired image quality level.

Generally, the emission efficiency of a scintillator plate depends of the phosphor layer thickness and X-ray absorbance of the phosphor. A thicker phosphor layer causes more scattering of emission within the phosphor layer, leading to deteriorated sharpness. Accordingly, necessary sharpness for desired image quality level necessarily determines the layer thickness.

Specifically, cesium iodide (CsI) used in the phosphor layer of a scintillator plate exhibits a relatively high conversion rate of from X-ray to visible light. Further, a columnar crystal structure of the phosphor can readily be formed through vapor deposition and its light guide effect inhibits scattering of emitted light within the crystal, enabling an increase of the phosphor layer thickness.

To achieve enhanced sharpness of a scintillator plate, there was proposed a manufacturing method of a radiation image conversion panel, comprising forming a phosphor layer through gas phase deposition. Gas phase deposition methods include a vapor deposition method and a spattering method. In the vapor deposition method, for instance, a vaporization source composed of raw phosphor material is heated by a resistance heater or exposure to an electron beam to vaporize the vaporization source and allow a distillate to be deposited on the substrate surface, forming a phosphor layer comprised of columnar phosphor crystals. The use of a single vaporization source makes it feasible to achieve uniform deposition.

In the formation of a phosphor layer, since the use of CsI alone results in lowered emission efficiency, there may be used various additives. It is known that an additive content of not less than 0.01 mol %, based on CsI enhances emission efficiency.

There was disclosed a technique for use as an X-ray phosphor in which a mixture of CsI and sodium iodide (NaI) at any mixing ratio was deposited on the substrate to form sodium-activated cesium iodide (CsI:Na), which was further subjected to annealing as a post-treatment to achieve enhanced visible-conversion efficiency, as set forth in JP-B No. 54-35060 (hereinafter, JP-B refers to Japanese Patent Publication).

Recently, there was also disclosed a technique for preparing an X-ray phosphor in which CsI is formed through deposition and activation material such as indium (In), thallium (Tl), lithium (Li), potassium (K), rubidium (Rb) or sodium (Na) was formed by spattering, as set forth in, for example, JP-A No. 2001-59899 (hereinafter, the term JP-A refers to Japanese Patent Application Publication).

SUMMARY OF THE INVENTION

However, the emission efficiency of X-ray phosphors prepared according to the methods set forth in JP-B No. 54-35060 and JP-A No. 2001-59899 was still low. Specifically, although JP-A No. 2001-59899 described additives to CsI, there was no disclosure noting melting points such additives and improvements were desired for emission efficiency upon exposure to radiation.

The present invention has come into being in light of the foregoing situations. It is an object of the invention to provide a scintillator plate which is CsI-based and exhibits enhanced emission efficiency upon exposure to radiation, thereby achieving enhanced light emission luminance.

As a result of extensive study by the inventors, it was discovered that inclusion of a specific additive having a melting point falling within the range of ±70° C. of the melting point of CsI to raw material resulted in markedly enhanced emission efficiency of the formed columnar crystal (which achieved efficient luminance even when initially forming a uniform phosphor layer to omit a post-processing such as annealing to even inhomogeneous additives after formation of the phosphor layer).

Thus, it was discovered that a raw material comprised of CsI which was superior material as a radiation image detecting phosphor and a specific additive having a melting point within ±70° C. of the melting point of CsI was vapor-deposited on the substrate to form columnar crystals, which provided a radiation image detecting plate exhibiting enhanced emission efficiency upon exposure to radiation.

One aspect of the invention is directed to a method of preparing a scintillator plate comprising on a substrate a phosphor layer comprising a thallium activated phosphor, the method comprising vapor-depositing CsI and a thallium compound on the substrate to form the phosphor layer, wherein the thallium compound exhibits a melting point which falls within the range of ±70° C. of the melting point of CsI.

Another aspect of the invention is directed to a scintillator plate comprising on a substrate a phosphor layer comprising a thallium activated phosphor, wherein the phosphor layer is formed by a process comprising vapor-depositing CsI and a thallium compound on the substrate and the thallium compound exhibits a melting point falling within ±70° C. of the melting point of CsI.

DETAILED DESCRIPTION OF THE INVENTION

There will be described preferred embodiments of the invention but the invention is not limited to these.

First, the preferred embodiments of the invention will be described with reference to drawings but the invention is by no means limited to these.

Figure 1:
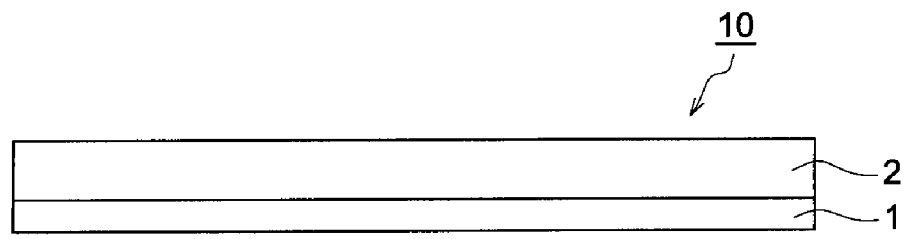
FIG. 1 illustrates a sectional view of a scintillator plate of the invention.

As shown in FIG. 1, a scintillator plate 10 for radiation, of the invention is provided with a phosphor layer 2 on a substrate 1. When the phosphor layer 2 is exposed to radiation, the phosphor layer 2 emits an electromagnetic wave at the wavelength of 300 to 800 nm, centered on visible light, upon absorption of incident radiation energy.

The substrate 1, which is transparent to radiation such as X-rays, employs a resin or glass substrate or a metal plate, but a 1 mm thick aluminum plate or resin sheets such as carbon-fiber-reinforced resin sheet are preferably used in terms of enhanced durability and lightweight.

The phosphor layer 2 is formed of Cs-based crystals and CsI is preferred.

To the phosphor layer 2 is incorporated a thallium compound as an additive exhibiting a melting point falling within the range of ±70° C. of the melting point of CsI (that is 621° C.). The melting point falling within the range of 70° C. of the melting point of CsI refers to a melting point in the range of from the melting point of CsI (621° C.) minus 70° C. (=551° C.) to the melting point of CsI (621° C.) plus 70° C. (=691° C.). Thus, the melting point of an additive such as a thallium compound is within the range of ±70° C. of the melting point of CsI, and preferably within ±50° C. Exceeding this range results in inhomogeneous existence of an additive, giving rise to concern of reduced emission efficiency. Examples of such a thallium compound include thallium(I) oxide (596° C.) and thallium(I) sulfate (632° C.).

Such a thallium compound is added preferably in an amount of 0.001 to 50 mol %, more preferably 0.01 to 30 mol %, and still more preferably 0.1 to 10.0 mol %.

An additive in an amount of less than 0.001 mol % results in an emission luminance which is substantially the same as that of CsI alone, rendering it impossible to achieve the targeted emission luminance.

The upper limit is more preferably 10 mol %. More than 50 mol % renders it difficult to form columnar crystals.

The amount of an additive, as defined above, refers to an amount of the additive in materials used for formation of the phosphor layer 2. In the invention, since the phosphor layer 2 is formed by the process of vapor deposition, the materials used for formation of the phosphor layer 2 refer to raw materials as a supply source (deposition source) in the process of vapor deposition, for example, a mixture of CsI and a thallium compound. In the invention, the melting point refers to a melting point under ordinary temperature and ordinary humidity.

There will be described a method of forming the phosphor layer 2 on the substrate 1.

The phosphor layer 2 is formed by the process of vapor deposition, which is performed in the following manner. The substrate 1 is set inside a commonly known deposition apparatus and raw material for the phosphor layer 2 including prescribed additives is charged into a deposition source. Thereafter, the inside of the apparatus is evacuated to vacuum at 1.333 Pa to $1.33 \times 10^{-3}$ Pa, concurrently with introducing inert gas such as nitrogen from the entrance. Subsequently, at least one of raw materials of a phosphor is vaporized with heating by a method such as a resistance heating method or an electron beam method and deposited on the substrate 1 to form a phosphor layer (2) having a prescribed thickness. This deposition process may be repeated plural times to form the phosphor layer (2). For example, plural deposition sources of an identical constitution are prepared and when completing deposition of one deposition source, deposition of the next deposition source is started. These are repeated until reaching the desired layer thickness to form the phosphor layer (2).

The phosphor layer (2) formed on the substrate (1) results in homogeneous inclusion of the additive. Thus, incorporation of an additive having a melting point within the range of ±70° C. of the melting point of CsI result in uniform distribution of emission within the phosphor layer.

The substrate (1) may optionally be heated or cooled during deposition. After completion of deposition, the substrate (1) and the phosphor layer (2) as a whole may be subjected to a heating treatment.

Figure 2:
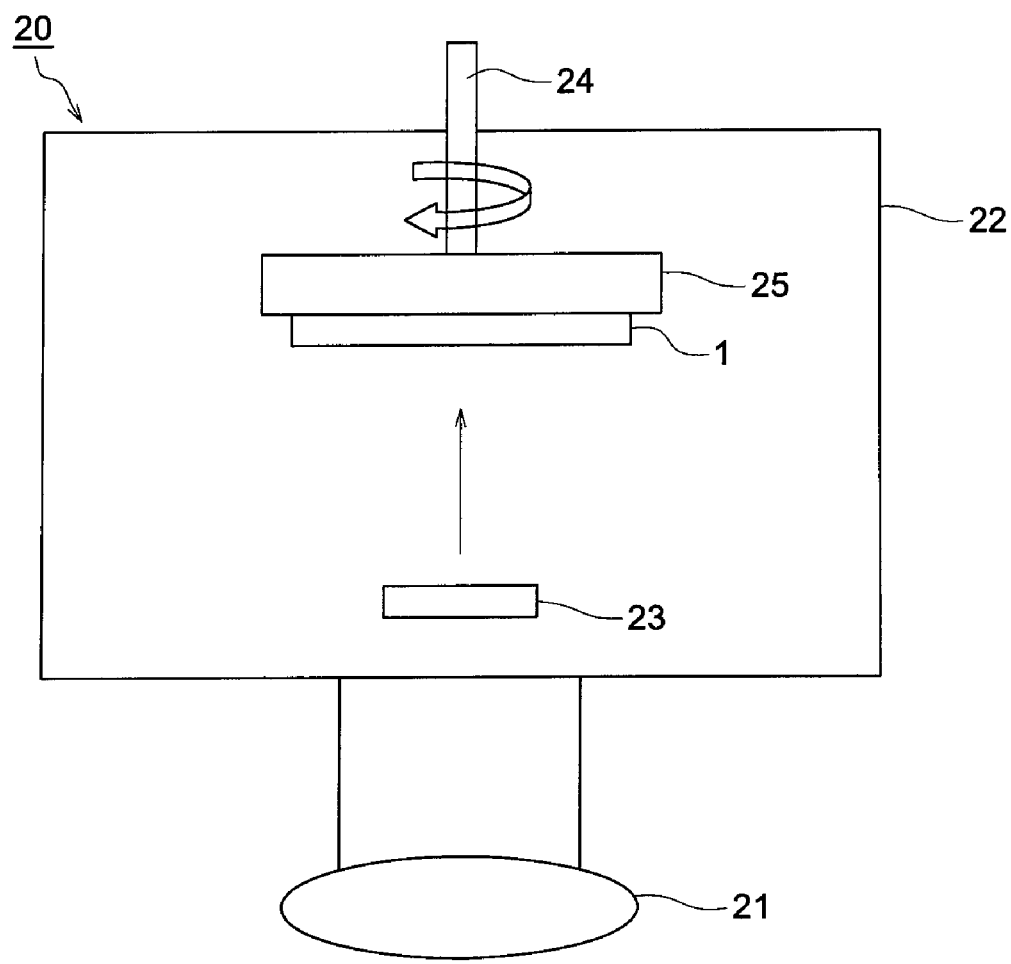
FIG. 2 illustrates a deposition apparatus usable in the invention.

With reference to FIG. 2, there will be described a deposition apparatus 20, as one example of deposition apparatuses used when performing vapor deposition.

The deposition apparatus is provided with a vacuum pump 21 and a vacuum vessel 22 which is internally evacuated by operation of the vacuum pump 21. A resistance heating crucible 23 as a deposition source is provided in the inside of the vacuum vessel. On the upper side of the resistance heating crucible 23, a substrate (1) is provided via a substrate holder 25 which is pivotable through a rotation mechanism 24. A slit to control a vapor stream of a phosphor vaporized from the resistance heating crucible 23 is provided between the resistance heating crucible 23 and the substrate (1). When operating the deposition apparatus 20, the substrate 1 is used while placed on the substrate holder 25.

There will be described action of scintillator plate 10.

In the scintillator plate 10 for radiation, when radiation falls toward the substrate (1) from the phosphor layer (2) side, radiation energy falling on the phosphor layer (2) is absorbed by phosphor particles contained in the phosphor layer (2) and electromagnetic wave (light) corresponding to its strength are emitted from the phosphor layer (2).

At that time, the distribution of the emitting amount in the phosphor layer formed on the substrate (1) is uniform and columnar crystals constituting the phosphor layer (2) are regularly formed. Accordingly, the phosphor layer (2) results in enhanced emission efficiency of instantaneous emission, whereby radiation sensitivity of the scintillator plate is markedly enhanced.

Thus, the scintillator plate 10 for radiation of the invention achieves markedly enhanced emission efficiency upon exposure to radiation, leading to enhanced emission luminance. Thereby, enhanced SN ratio of the obtained radiation image is achieved even at the time of low dose imaging.

EXAMPLES

The present invention will be described with reference to examples but is by no means limited to these.

Example 1

Scintillator Plate 1

Deposition Source Material:

Thallium sulfate as additive raw material in an amount of 0.3 mol % was added to CsI, mixed and pulverized in a mortar to obtain deposition source materials.

Preparation of Scintillator Plate:

Using the deposition apparatus 20 shown FIG. 2, the foregoing deposition source materials were deposited on one side of a support (substrate) comprised of a carbon-fiber-reinforced resin sheet to form a phosphor layer.

First, the deposition source materials were charged into the resistance heating crucible 23, the substrate (1) was set onto the substrate holder 25 which was pivotable by the rotation mechanism 24 and the distance between the substrate 1 and the resistance heating crucible 23 was adjusted to 400 mm. Subsequently, after the inside of the deposition apparatus 22 was evacuated by the vacuum pump 21, Ar gas was introduced thereto and the degree of vacuum was adjusted to 0.1 Pa, then, the temperature of the substrate (1) was maintained at 150° C., while rotating the substrate (1) at a rate of 10 rpm by the rotation mechanism 24. Subsequently, the phosphor was deposited with heating the resistance heating crucible 23. When the phosphor layer reached a thickness of 500 μm, deposition onto the substrate (1) was completed to obtain scintillator plate 1 (invention).

Scintillator Plate 2

Scintillator plate 2 according to the invention was prepared similarly to the foregoing scintillator plate 1, except that thallium sulfate was replaced by 0.3 mol % of thallium oxide, as additive raw material.

Scintillator Plate 3

Scintillator plate 3 was prepared similarly to the foregoing scintillator plate 1, except that thallium sulfate was replaced by 0.3 mol % of thallium iodide, as additive raw material.

Scintillator Plate 4

Scintillator plate 4 was prepared similarly to the foregoing scintillator plate 1, except that thallium sulfate was replaced by 0.3 mol % of thallium carbonate, as additive raw material.

Scintillator Plate 5

Scintillator plate 5 was prepared similarly to the foregoing scintillator plate 1, except that thallium sulfate was replaced by 0.3 mol % of europium iodide, as raw additive material.

Scintillator Plate 6

Scintillator plate 6 was prepared similarly to the foregoing scintillator plate 1, except that thallium sulfate was replaced by 0.3 mol % of thallium (III) iodide, as raw additive material.

Scintillator Plates 7-12

Scintillator Plates 7-12 were each prepared similarly to the foregoing scintillator plate 1, except that an amount of thallium sulfate was varied as shown in Table 1.

Evaluation

Each of the thus obtained radiation image conversion panels was exposed to X-rays at a tube voltage of 80 kVp from the back side of the plate. The instantaneous emission was taken out through an optical fiber and the light-emitting amount was measured by a photodiode (S2281, produced by Hamamatsu Photonics Co.) The obtained value was represented as emission luminance (sensitivity), provided that the emission luminance was represented by a relative value, based on the emission luminance of scintillator 3 (Comp.) being 1.0.

Results are shown in Table 1.

TABLE 1

| | Phosphor Layer | | | | | | |
|---|---|---|---|---|---|---|---|
| | CsI | | | Thallium Compound | | | |
| | | | | | Melting Point | | |
| Scintillator Plate No. | Melting Point (° C.) | Content (mol %) | Compound | (° C.) | Difference in melting point (° C.)* | Content (mol %) | Emission Luminance |
| 1 (Inv.) | 621 | 99.7 | thallium(I) sulfate | 632 | 11 | 0.3 | 2.1 |
| 2 (Inv.) | 621 | 99.7 | thallium(I) oxide | 596 | −25 | 0.3 | 1.7 |
| 3 (Comp.) | 621 | 99.7 | thallium(I) iodide | 441 | −180 | 0.3 | 1.0 |
| 4 (Comp.) | 621 | 99.7 | thallium(I) carbonate | 272 | −349 | 0.3 | 0.7 |

TABLE 1-continued

| | Phosphor Layer | | | | | | |
|---|---|---|---|---|---|---|---|
| | CsI | | | Thallium Compound | | | |
| | | | | | Melting Point | | |
| Scintillator Plate No. | Melting Point (° C.) | Content (mol %) | Compound | (° C.) | Difference in melting point (° C.)* | Content (mol %) | Emission Luminance |
| 5 (Comp.) | 621 | 99.7 | europium iodide | 580 | −41 | 0.3 | 0.6 |
| 6 (Comp.) | 621 | 99.7 | thallium(III) oxide | 716 | 95 | 0.3 | 0.8 |
| 7 (Inv.) | 621 | 99.995 | thallium(I) sulfate | 632 | 11 | 0.005 | 1.1 |
| 8 (Inv.) | 621 | 99.95 | thallium(I) sulfate | 632 | 11 | 0.05 | 1.4 |
| 9 (Inv.) | 621 | 99.9 | thallium(I) sulfate | 632 | 11 | 0.1 | 1.8 |
| 10 (Inv.) | 621 | 99.4 | thallium(I) sulfate | 632 | 11 | 0.6 | 2.4 |
| 11 (Inv.) | 621 | 99.0 | thallium(I) sulfate | 632 | 11 | 1.0 | 2.7 |
| 12 (Inv.) | 621 | 90.0 | thallium(I) sulfate | 632 | 11 | 10.0 | 3.2 |

*Difference of a melting point of a thallium compound from that of CsI

As apparent from Table 1, it was proved that enhanced luminance was achieved in scintillator plates having on a substrate a phosphor layer which was formed by vapor-deposition of CsI and a thallium compound exhibiting a melting point falling within +70° C. of that of CsI.

What is claimed is:

1. A method of preparing a scintillator plate comprising on a substrate a thallium activated phosphor layer, the method comprising:
    depositing CsI and a thallium compound to form the phosphor layer on the substrate,
    wherein the thallium compound exhibits a melting point falling within a range of ±70° C. of a melting point of CsI, and
    wherein prior to depositing CsI and a thallium compound, the method comprises
    heating a mixture of CsI and the thallium compound.

2. The method of claim 1, wherein the thallium compound exhibits a melting point falling within a range of ±50° C. of the melting point of CsI.

3. The method of claim 1, wherein the thallium compound is thallium(I) oxide or thallium(I) sulfate.

4. The method of claim 1, wherein the thallium compound accounts for 0.001 to 50 mol % of total amount of CsI and the thallium compound.

5. The method of claim 1, wherein the thallium compound accounts for 0.01 to 30 mol % of a total amount of CsI and the thallium compound.

6. The method of claim 1, wherein the thallium compound accounts for 0.1 to 10 mol % of a total amount of CsI and the thallium compound.

7. The method of claim 1, wherein the thallium activated phosphor is a thallium activated cesium iodide.

8. The scintillator plate of claim 7, wherein the thallium activated phosphor is a thallium activated cesium iodide.

* * * * *